United States Patent
Fung et al.

(10) Patent No.: US 8,161,355 B2
(45) Date of Patent: Apr. 17, 2012

(54) AUTOMATIC REFRESH FOR IMPROVING DATA RETENTION AND ENDURANCE CHARACTERISTICS OF AN EMBEDDED NON-VOLATILE MEMORY IN A STANDARD CMOS LOGIC PROCESS

(75) Inventors: Stephen Fung, Cupertino, CA (US); Vithal Rao, San Jose, CA (US); Da-Guang Yu, Fremont, CA (US); J. Eric Ruetz, Soquel, CA (US); Chee T. Chua, Fremont, CA (US); Jawji Chen, Fremont, CA (US); Kameswara K. Rao, San Jose, CA (US)

(73) Assignee: MoSys, Inc., Santa Clara, CA (US)

( * ) Notice: Subject to any disclaimer, the term of this patent is extended or adjusted under 35 U.S.C. 154(b) by 686 days.

(21) Appl. No.: 12/378,249

(22) Filed: Feb. 11, 2009

(65) Prior Publication Data

US 2010/0205504 A1    Aug. 12, 2010

(51) Int. Cl.
  *G11C 29/00*    (2006.01)
(52) U.S. Cl. ............... 714/763; 365/185.22; 365/185.29
(58) Field of Classification Search .................. 714/719, 714/763, 773; 365/185.22, 185.25, 185.29
  See application file for complete search history.

(56) References Cited

U.S. PATENT DOCUMENTS

| | | | |
|---|---|---|---|
| 4,359,772 A | 11/1982 | Patel | |
| 5,142,541 A | 8/1992 | Kim et al. | |
| 5,574,684 A | 11/1996 | Tomoeda | |
| 6,088,268 A * | 7/2000 | Gupta et al. | 365/185.25 |
| 6,421,757 B1 * | 7/2002 | Wang et al. | 711/103 |
| 6,496,437 B2 | 12/2002 | Leung | |
| 6,751,123 B2 | 6/2004 | Katayama et al. | |
| 6,751,127 B1 * | 6/2004 | Chou et al. | 365/185.25 |
| 6,901,011 B2 * | 5/2005 | Micheloni et al. | 365/185.22 |
| 7,051,264 B2 * | 5/2006 | Leung et al. | 714/763 |
| 7,173,862 B2 * | 2/2007 | Futatsuyama et al. | 365/185.33 |
| 7,283,397 B2 * | 10/2007 | Harari et al. | 365/185.22 |
| 7,353,438 B2 | 4/2008 | Leung et al. | |
| 7,360,136 B2 | 4/2008 | Guterman et al. | |
| 7,379,341 B2 | 5/2008 | Shen et al. | |
| 7,386,765 B2 | 6/2008 | Ellis et al. | |
| 7,392,456 B2 | 6/2008 | Leung et al. | |
| 7,426,678 B1 | 9/2008 | Cory et al. | |
| 2001/0015905 A1 * | 8/2001 | Kim et al. | 365/51 |
| 2004/0153902 A1 | 8/2004 | Machado et al. | |
| 2004/0170060 A1 * | 9/2004 | Ishimoto | 365/185.25 |
| 2006/0120156 A1 * | 6/2006 | Kawai et al. | 365/185.17 |
| 2006/0245259 A1 * | 11/2006 | Fukuda et al. | 365/185.22 |

(Continued)

OTHER PUBLICATIONS

M. Y. Hsiao, "A Class of Optimal Minimum Odd-Weight-Column SEC-DED Codes," IBM J. Res. Develop., Jul. 1970, pp. 395-401.

(Continued)

*Primary Examiner* — Yolanda L Wilson
(74) *Attorney, Agent, or Firm* — Bever, Hoffman & Harms, LLP

(57) ABSTRACT

A method for selectively refreshing data in a nonvolatile memory array based on failure type detected by an error correction code. If the page is determined to be error-free, no refresh operation takes place. Otherwise, if single-error words on a page contain erased and programmed bit errors, then a refresh operation, consisting of an erase and program, takes place. The erase operation is skipped if single-error words on a page solely contain a program failure.

24 Claims, 5 Drawing Sheets

U.S. PATENT DOCUMENTS

| | | | |
|---|---|---|---|
| 2006/0291289 A1* | 12/2006 | Lee | 365/185.22 |
| 2007/0109858 A1* | 5/2007 | Conley et al. | 365/185.11 |
| 2007/0297236 A1* | 12/2007 | Tokiwa | 365/185.22 |
| 2008/0068912 A1 | 3/2008 | Lee | |
| 2008/0109705 A1 | 5/2008 | Pawlowski et al. | |
| 2008/0301525 A1 | 12/2008 | Hirose | |
| 2009/0024904 A1* | 1/2009 | Roohparvar et al. | 714/773 |
| 2010/0070801 A1* | 3/2010 | Cornwell et al. | 714/6 |
| 2010/0199150 A1* | 8/2010 | Shalvi et al. | 714/773 |
| 2011/0096605 A1* | 4/2011 | Kosaki et al. | 365/185.17 |
| 2011/0141812 A1* | 6/2011 | Choi et al. | 365/185.09 |

OTHER PUBLICATIONS

Search report for PCT/US2010/000376 dated Jun. 4, 2010.

\* cited by examiner

AUTOMATIC REFRESH FOR IMPROVING DATA RETENTION AND ENDURANCE CHARACTERISTICS OF AN EMBEDDED NON-VOLATILE MEMORY IN A STANDARD CMOS LOGIC PROCESS

RELATED APPLICATIONS

The present application is related to U.S. Pat. No. 7,353,438 B2, entitled "Transparent Error Correcting Memory"; and U.S. Pat. No. 7,051,264 B2, entitled "Error Correcting Memory and Method of Operating Same". This application is also related to U.S. patent application Ser. No. 12/378,248 entitled "Data Restoration Method for a Non-Volatile Memory" by Jeong Y. Choi. The disclosure of the aforementioned patent application and patents are incorporated by reference herein.

FIELD OF THE INVENTION

The present invention relates to non-volatile memories (NVM). More particularly, this invention relates to non-volatile memory cells fabricated using an application specific integrated circuit (ASIC) or conventional logic process. This invention further relates to a method of operating a non-volatile memory to ensure maximum data retention time. The invention also relates to a system-on-chip (SoC) architecture which includes both non-volatile memory and dynamic random access memory (DRAM) that operates like static random access memory (SRAM), wherein the SoC is fabricated using a conventional logic process.

BACKGROUND

A nonvolatile memory cell has two gates separated by an insulator layer. The floating gate electrode consists of polysilicon and is vertically separated from a control gate by the insulator layer. The control gate functions to provide external current control to the nonvolatile memory. Examples of non-volatile memory as used herein include, but are not limited to, flash memory, EEPROM, CAM, and CD-ROM. Whenever the term flash memory is used herein, it is understood not to limit the invention to strictly flash memories, but to include all of the aforementioned nonvolatile memories.

A flash memory stores data in the form of charge on a floating gate that is insulated by two insulator layers. To store data in a floating gate, the memory cell is either programmed or erased. Conventionally, a logical "0" is stored by a programmed cell and a logical "1" is stored by an erased memory cell. Over time, the logical values in a memory array can be inadvertently changed due to charge leakage or disturbs resulting from accesses to adjacent rows.

Programming in a nonvolatile memory is performed by storing electrons on the floating gate to obtain a logical state of "0". In a "0" state the bit draws current of approximately greater than 10 microAmps when the read voltage is applied to the memory cell. Erasing of data is performed by removing electrons from the floating gate to generate a logical state of "1". In a "1" state, the bit draws a small current of less than 1 microAmp when the read voltage is applied to the memory cell.

In a flash memory data, a byte or word can be read in a mere 20 to 100 ns period. On the other hand, programming a byte or word requires a few microseconds, while erasing can consume up to several seconds of time.

RELATED ART

For system-on-chip (SoC) applications, it is desirable to integrate many functional blocks into a single integrated circuit. The most commonly used blocks include a microprocessor or micro-controller, memory blocks, and various functional logic blocks, all of which are fabricated on the same chip. The memory blocks can include any combination of volatile random access memory (SRAM), non-volatile memory and/or register-based memory. The register-based memory is typically used where a small amount of high speed storage is required (e.g., for register files and/or small tables to be used by one or more functional logic blocks within the SoC).

If a large non-volatile memory block is also required, it would be advantageous to be able to use the same process for fabricating the functional logic blocks, 1T-SRAM system and the non-volatile memory block to realize a low cost SoC. It would further be desirable if all of these elements could be fabricated using a conventional logic process. However, traditional processes for fabricating non-volatile memory, which typically use stacked gate or split-gate memory cells, are not compatible with a conventional logic process.

As used herein, a conventional logic process is defined as a semiconductor process that uses a single layer of polysilicon (i.e., a single conductive gate layer), without the addition of material in the gate-oxide. It would therefore be desirable to implement a single-polysilicon non-volatile memory cell using a conventional logic process, where the possibility of over-erase conditions are minimized, and the detection of over-erase conditions is simplified. It would also be advantageous to be able to program and read the non-volatile memory cell while minimizing disturbances from write, erase and read operations, thereby improving the life and reliability of an array fabricated using the non-volatile memory cell.

Because data stored in a nonvolatile memory can lose charge or gain charge over time, it is expected that single bit errors will arise. To address the possibility of a defective bit, periodic refreshes are performed on flash memory arrays. Consequently, refreshing memory cells in a nonvolatile memory is sometimes performed unnecessarily to ensure that data integrity is preserved. It is therefore further desirable to implement a more precise method of refreshing memory cells.

SUMMARY OF THE INVENTION

The present invention improves data retention for an entire flash memory array. The present invention minimizes refresh time by distinguishing between the type of failures that produce an erroneous read out of data from a page of memory.

In accordance with the present invention a method is disclosed for selectively refreshing a memory embedded in a semiconductor integrated circuit. The method involves reading one or more words sequentially out of a page of memory; and then checking the integrity of each word with an error correction code (ECC) to determine the type of error failure that may be present. If the ECC generates a signal indicating that all of the words on a page are error-free then the page will not be refreshed.

Yet another embodiment of the invention provides a method for detecting and selectively refreshing a memory array having n number of data words in a row, each row being organized in a plurality of pages. In accordance with this method, each data word is sequentially read out of a first page and into an external buffer while the integrity of each data word within the first page is checked with ECC. This method involves generating a signal to indicate whether any data word on the first page contains an error; checking each data word on a next page in the memory array to determine if an error exists, and providing a signal if any data word on said next page contains an error. The advantage of this invention is that a refresh operation is skipped for each page of the memory array that is found to be error-free. If a refresh is considered necessary, it is optimized based on the type of error detected. Each subsequent page is read out and checked for errors until all pages of the memory array have been tested.

The various embodiments of the invention will be more fully understood in view of the following description and drawings.

DETAILED DESCRIPTION OF THE INVENTION

It would be desirable to construct a memory device in which the impact of refresh operations on external memory access is minimized. Accordingly, the present invention provides a memory system in which the majority of refresh operations are carried out within the memory device during idle memory cycles. Idle memory cycles are clock cycles in which there is not an on-going or pending access to the memory device.

The present invention improves data retention for an entire flash memory array. The present invention also improves endurance of digital data over the conventional nonvolatile memory by reducing the amount of time necessary to refresh the memory cells of an array.

Figure 1:
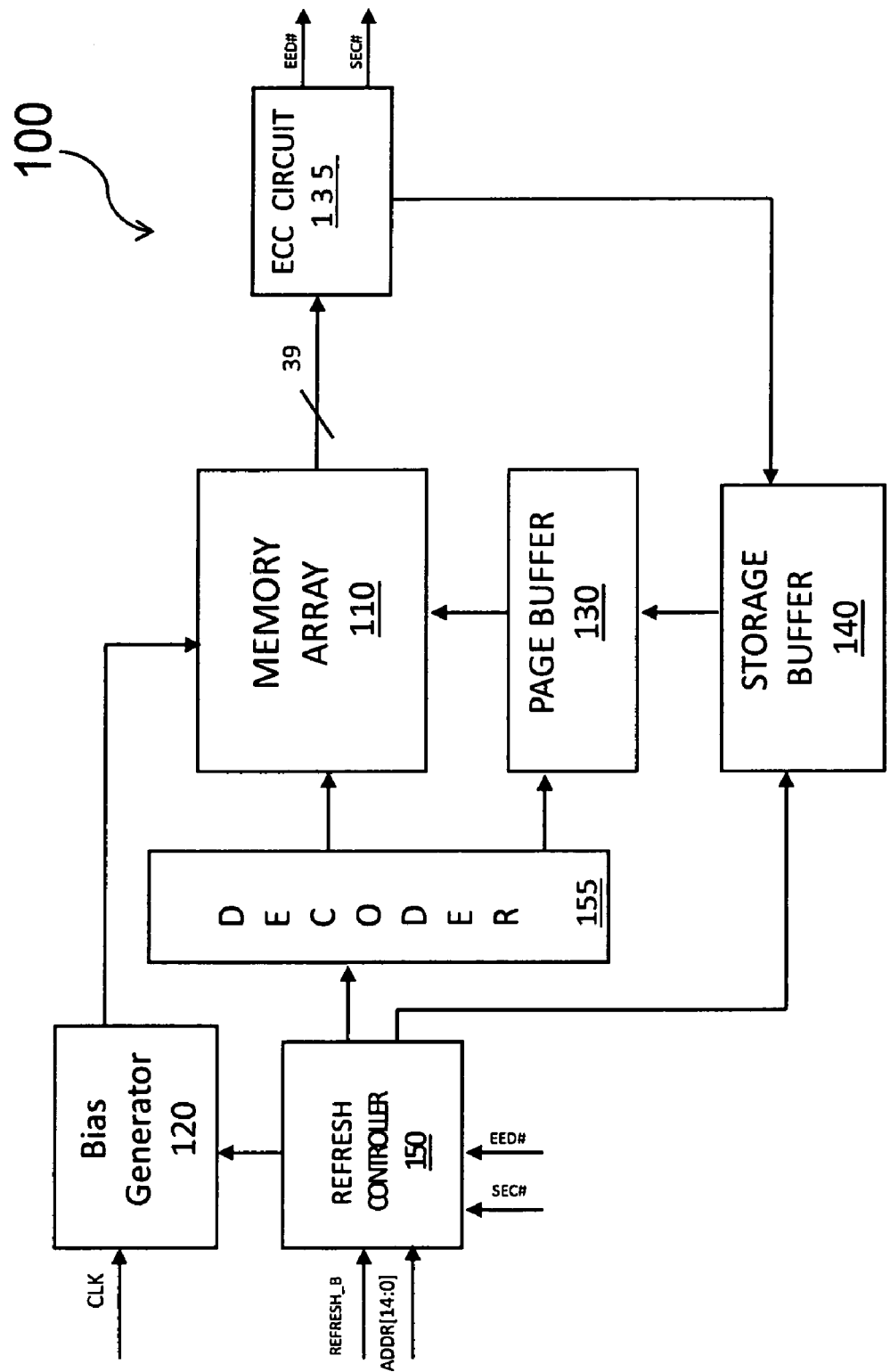
FIG. 1 is a block diagram of the embedded memory in accordance with the invention.

FIG. 1 is a schematic diagram of one embodiment of the invention. Memory block 100 includes memory array 110, page buffer 130, ECC logic 135, storage buffer 140, refresh controller 150, wordline decoder 155, and bias generator 120.

The various elements shown in FIG. 1 will now be described in further detail. FIG. 1 illustrates word line decoder 155 coupled to memory array 110. Memory array 110 has 64 k rows and 32 columns yielding 2 megabits of memory in one embodiment. However, it is understood that in other embodiments, memory array 110 can have a different size, thereby requiring other external address signals. Suitable sizes for the memory array 110 can range between 1 megabit up to 64 megabits. In one embodiment, the memory array is composed of NOR-type memory cells. However, the invention is also applicable to NAND-type flash memories as well. Decoder 155 selects a page of data from memory 110 based on the address requested by refresh controller 150. Specifically, refresh controller 150 provides the necessary address and control signals internally to word line decoder 155 to select the desired row from memory array 110. Refresh controller 150 can also initiate access to the memory array via the bias generator 120 by providing a refresh enable signal REFRESH_B to bias generator 120. In particular, the external access to memory 110 is detected at the rising clock edge on the activation of the REFRESH_B signal. Bias generator 120 generates a bias voltage for accessing the memory cells of memory 110.

Figure 3:
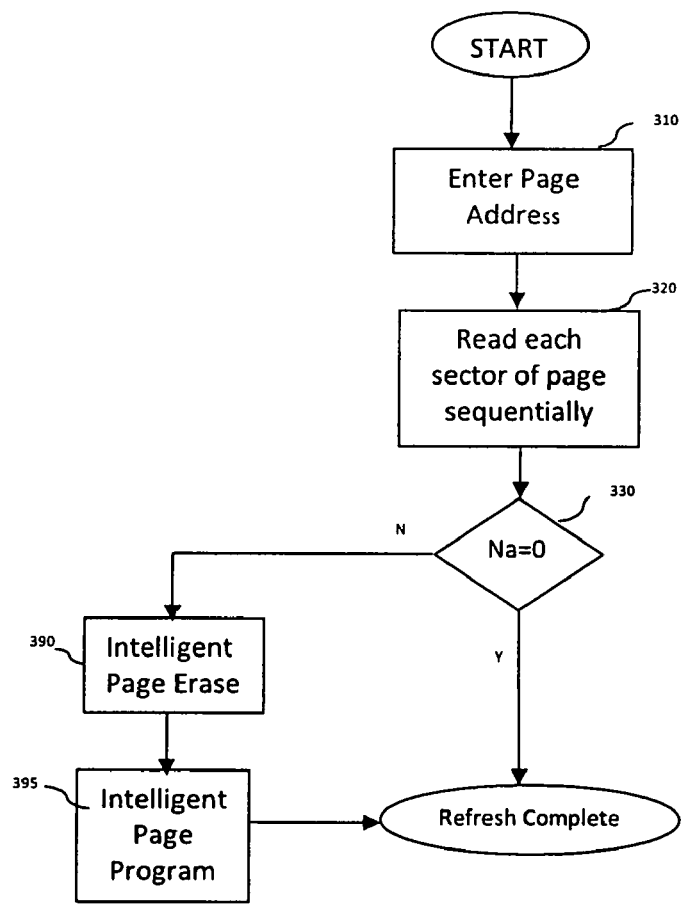
FIG. 3 is a flowchart illustrating one embodiment for correcting a single bit error detected in the page of FIG. 2.

Once a specific page of data is requested, the page is output to ECC circuit 135 for evaluation, and if necessary, correction. ECC circuit 135 transfers corrected data to storage buffer 140. ECC Circuit 135 includes both error correction code and an ECC generator. The ECC generator produces an ECC syndrome in response to each data word that is read into the ECC circuit. The syndrome in turn is used to produce a corrected word that will be subsequently moved to the storage buffer 140. An additional ECC generator (not shown) may be located as a separate input to storage buffer 140 for purposes of receiving external data. Such external data may be input to storage buffer 140 via a separate data input (not shown) that provides test patterns for performing various types of tests on the data of memory 110. The Storage buffer of FIG. 3 is coupled to the refresh controller 150 to receive addressing commands and thereby load data into the desired location of memory 110. Coupled to storage buffer 140 is a page buffer 130 that receives a complete page of data from the storage buffer once all the words of a specific page have been output by ECC circuit 135. In the absence of a storage buffer, the corrected data may be transferred directly from ECC circuit 135 to page buffer 130, in which case, refresh controller 150 would be coupled directly to page buffer 130.

Figure 2:
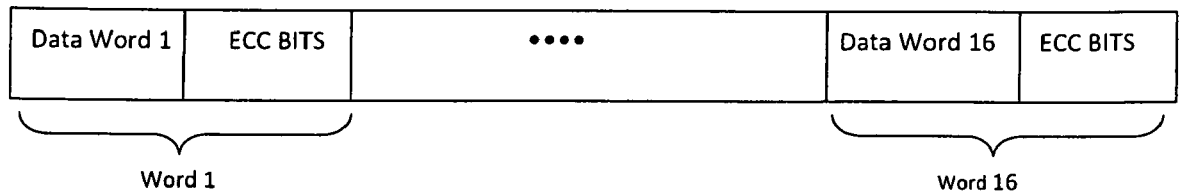
FIG. 2 is a diagram of a page of data stored in the memory array shown in FIG. 1.

FIG. 2 illustrates how each page of the memory array is divided into 16 words, and how each word stores a single data word concatenated with ECC check bits. As used herein, a "word" refers to an individual data word and its associated ECC bits. It is understood, however, that the present invention is not limited to solely pages containing 16 words, as other word sizes will work as well.

One of the purposes of the present invention is to identify what type of failure caused a specific error within a word of data. In particular, this invention determines whether or not an error constituted a program failure or an erase failure. Accordingly, FIG. 1 also illustrates signals SEC# and EED# that are transmitted by ECC circuit 135 to refresh controller 150. Error signals SEC# and EED# refer respectively to single error correction, and erase error detect. These two signals influence the refresh controller in determining what action to take after a word has been evaluated by ECC circuit 135. After a word of data has been checked by the ECC circuit 135, the word is read out into storage buffer 140, where the data is temporarily stored until an entire page of memory has been completely tested by the ECC circuit 135. If any word must be corrected, it will be provided with new ECC check bits by ECC circuit 135 and then read out in corrected form into storage buffer 140.

The present invention can determine if data bits have flipped polarity from either a logical "0" to a logical "1", or vice versa. Since each data word is concatenated with ECC check bits, the check bits are also being tested while the data bits are undergoing testing. The error correction code is preferably embedded on the same chip as memory 110 as shown in FIG. 1. In a preferred embodiment, the method of this invention utilizes a modified Hamming error correction code to determine the failure type and the number of errors that are present within a word. In the present invention, the odd-weight Hamming code discussed in "A Class of Optimal Minimum Odd-weight-column SEC-DED Codes" by M. Y. Hsiao in IBM Journal of Research and Development, pp. 395-401, July 1970 may be used to generated the six or seven-bit ECC codes in response to the 32-bit data words.

The manner in which a word containing a single bit error is refreshed will now be described in reference to FIG. 1. During a read operation, the address of a selected row is selected by decoder 155 and a first page of row data is provided to ECC circuit 135. Then words [15:0] of the first page are sequentially and separately read out of the ECC circuit 135 into storage buffer 140. A syndrome is generated by an ECC generator contained within the ECC circuit 135 to determine the location of the defective bit. The syndrome can be between 6 or 7 bits. In a preferred embodiment, the syndrome is 7 bits long. The size of the syndrome will vary depending on the particular embodiment of the invention. In accordance with FIG. 1, word 0 is first read into ECC circuit 135 to be evaluated for errors. If a single error in word 0 has been detected, the ECC circuit corrects the defective bit and appends new check bits to the corrected word. Thereafter, word 1 on the first page is loaded into the ECC circuit 135. If the ECC circuit determines that word 1 is error free, then word 1 will not be modified and will be moved into storage buffer 140 where word 0 is being temporarily stored. Reading out of each word will continue to proceed in sequence up to word 15, that is, until the entire page has passed through the ECC circuit and a syndrome has been generated for each word. If any one of the words on page 1 of the memory is correct, then the ECC circuit will not modify such words. Instead, correct words are merely loaded into page buffer 130 after the complete page has been read out of storage buffer 140. That is when storage buffer 140 is full, the system outputs the page of data to page buffer 130, whereupon, in the event of an erase failure, the complete page is first erased and then correctly programmed back into memory 110.

The present invention accordingly takes into account the syndrome data to correct errors that are found before such errors propagate further. By following this approach, the present invention can reduce the number of single-bit errors located in memory array 110. Subsequently, the storage buffer 140 will read out the first page in corrected format into page buffer 130. Then the corrected data from page buffer 130 in turn is written into memory array 110 to the address specified by refresh controller 150. System 100 will normally then be instructed to test the second page of the same row of memory 110.

Testing of the second page proceeds when the refresh controller provides an address to memory 110 for data words [31:16]. Array 110 thus outputs the second page containing words [31:16] into ECC circuit 135 and each word is individually-tested for errors. If no errors are detected in word 16, then word 16 will simply be loaded into storage buffer 140. Afterwards, the next word on the second page, word 17, is tested to determine if any errors are present in the data bits or check bits. If a single error is detected in word 17, it will be corrected once the entire page has been loaded into page buffer 130, in accordance with the failure type in the manner set forth in FIG. 5. That is, depending on whether a program failure or an erase failure generated the error will determine how data word 17 will be corrected. If a program failure is detected in word 17, the error will be identified by a signal and/or an error flag. Thereafter, word 17 is loaded into storage buffer 140. Next, word 18 is transferred from memory 110 into ECC logic 135.

A syndrome that characterizes the status of the bits in word 18 is generated by the ECC generator contained within ECC circuit 135, as in the case with words 16 and 17 above. If the syndrome determines that a single bit error is attributable to an erase failure in word 18, then an ERASE ER flag will be activated by the syndrome. In addition, ECC circuit 135 notifies the refresh controller 150 of an erase failure in word 18 by transmitting an ERASE error signal, EED#, to the refresh controller. Then after the entire page is loaded back into memory 110, the page is either reprogrammed or erased and then reprogrammed. That is, in the case of a program failure, reprogramming of the page of memory occurs within array 110 without any intervening erase operation being performed. Of course, with respect to an erase failure, the erasure that precedes programming will also occur after the page of memory has been completely tested. In which case, the erroneous data will be erased from memory 110 prior to programming the memory 110 with correct data. Testing of the second page will proceed uninterrupted until word 31 has been evaluated by ECC circuit 135. A refresh operation is activated on a positive clock edge. Specifically, when the refresh_start, page_refresh, and page_address pins are activated, the system will commence the page refresh mode shown in FIG. 3. Once the automatic page refresh mode is started, refresh can proceed to completion without any further intervention from the user. At this point, the device is inaccessible for purposes other than the refresh operation.

A simplified example for refreshing a data word will now be discussed in reference to FIG. 3. FIG. 3 illustrates a method for refreshing a single page of data. First, a specific page address is requested from the memory array in step 310. As a result, the requested page is then read out into ECC circuit 135. Then, each word of the selected page is separately evaluated by the ECC circuit for errors. In particular, each word is read out and separately tested for errors. An ECC syndrome is also produced internally to allow any correctible error to be corrected.

If all words of a given page are determined to be error-free in step 330 then refresh is complete. In actuality, no refresh operation is performed on an error-free page. This method of performing page refresh is selective because if the bits are read out properly, without any errors, then it is unnecessary to subject the page to a refresh operation. Thus, an error-free page will simply be read and no erase or program steps will occur. Once the final word of the error-free page is transferred to storage buffer 140, the entire error-free page will be moved to page buffer 130 to be read back into memory 110.

If on the other hand, the page is determined to include defective words, a signal is generated in step 330 by the ECC circuit to alert the controller as to what action to take. In one embodiment, the signal may be a global flag that changes state when an error is detected. In step 370, if is determined that the error arose from an erased bit, then it becomes essential to erase the entire page in accordance with step 390. This is significant because if single bit errors were inadvertently erased, it is necessary to erase the entire source page together. Subsequent to erasing a page containing an erase failure, programming of correct data can begin immediately. After a correctible page has been erased, the intelligent program step of 395 is executed. At step 395 the corrected page is loaded into the memory array using a self-timed operation. After the intelligent page program 395, the device is free to be accessed for any purpose and the refresh is complete.

ECC circuit generates new check bits for a corrected data word and then reads out the corrected word into storage buffer 140. Almost simultaneously, the ECC circuit 135 provides an error signal to characterize the type of failure that has been detected. Error signals such as SEC#, or EED# of FIG. 1 are provided to refresh controller 15 to guide system 100 in calculating the appropriate next steps to perform in correcting detected errors. Status signals are also generated by the ECC circuit, and can constitute various types of flags that change state when a specific condition is met. For example, a global flag may be raised high if an error is detected. In addition, an erase flag can be set to a specific value to indicate that the error was caused by an erase failure.

The data from memory 110 can be evaluated at periodic intervals, although preferably the integrity of the data is checked when the memory array is idle. That is, if the memory is not being accessed for reading or writing, then its data can be evaluated for correctness. In addition, the memory can be checked for integrity at power up.

Figure 4:
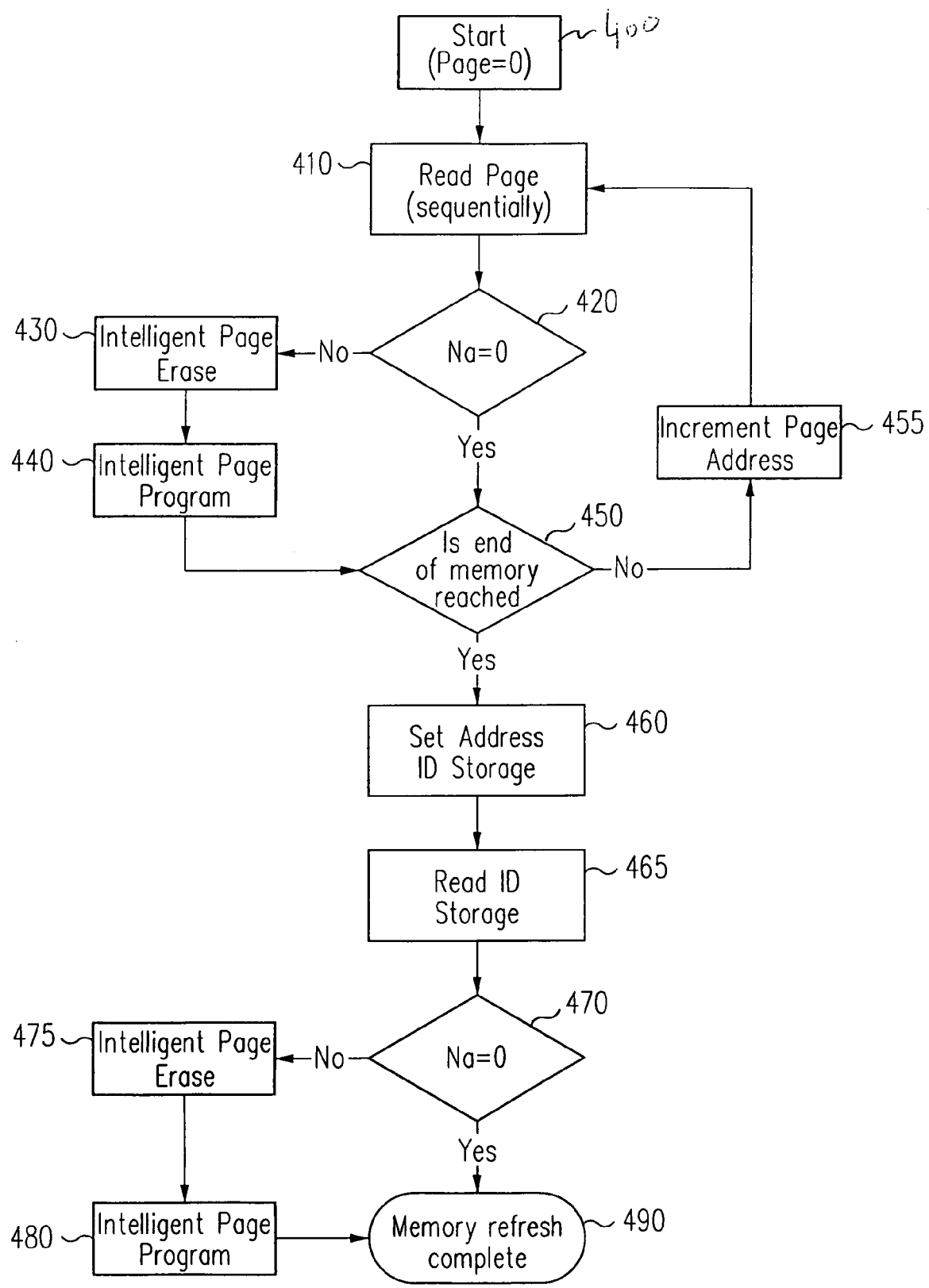
FIG. 4 is a flowchart illustrating the method for refreshing an entire nonvolatile memory array in accordance with one embodiment of the invention.

A second embodiment of the invention, as it applies to refreshing an entire memory, will be explained in conjunction with FIG. 4. The refresh mode for all of memory array 110 is an internal operation that is initiated when a Refresh Start signal is asserted high. When Refresh Start is asserted high, a busy signal is activated to indicate that the system 100 is occupied. At START (step 400), a page pointer is set to zero and then the first data word of page 0 is read out as shown in 410. While the first data word is being read, it is also being checked for errors by the error correction code. Then the second data word of page 0 is read out and also checked for potential errors. The reading of each data word proceeds until the final word is read out of memory array 100 and loaded into storage buffer 110. If assuming during the reading of data word 5, an error is detected, a global flag will change state to indicate the error. However, data words 6-16 will still be sequentially read out into storage buffer 110 after the error in word 5 is detected. In this example, if a word on page 0 contained an erase failure, the system will automatically erase page 0 at step 430. Page 0 will then be reprogrammed as correct data into memory array 100 in accordance with step 440. The refresh operation from step 400 and up to step 440 consumes approximately 13 milliseconds. If the end of memory array has not been reached 450, the page pointer is incremented in step 455, and the next page of memory array 100 is set to be tested. After completion of the refresh path comprising steps 420, 430, 440 and 450, the page pointer is incremented again in step 455, and reading of the next page of memory array 100 is initiated. This process is repeated until the end of memory array 100 is reached. The present invention can also check the integrity of other data external to the memory array. This feature is also illustrated in the flow chart of FIG. 4 with respect to addressing code. Specifically, in step 460 of FIG. 4, the Address ID storage is now ready to be checked for data integrity. The Address ID storage is separately addressable by memory array 100 and contains additional code that is used by the system to store configuration and other data that may need to be isolated from the main array.

To initiate step 460, a specific value for the Address ID storage is set. Next, each row of the ID storage is read out in sequence into a temporary storage buffer. If the ID Storage is error-free then the yes branch of step 470 will be executed and the memory refresh will be complete. Under those circumstances, the error-free Address ID will be reloaded into the ID storage from the temporary storage buffer.

On the other hand, if an error is identified in the ID storage then steps 475 and 480 will be executed to enable an intelligent erase and an intelligent programming of the Address ID data which is written out in corrected form from the temporary storage buffer into the Address ID storage. After step 480 is performed then the memory refresh is complete 490.

Figure 5:
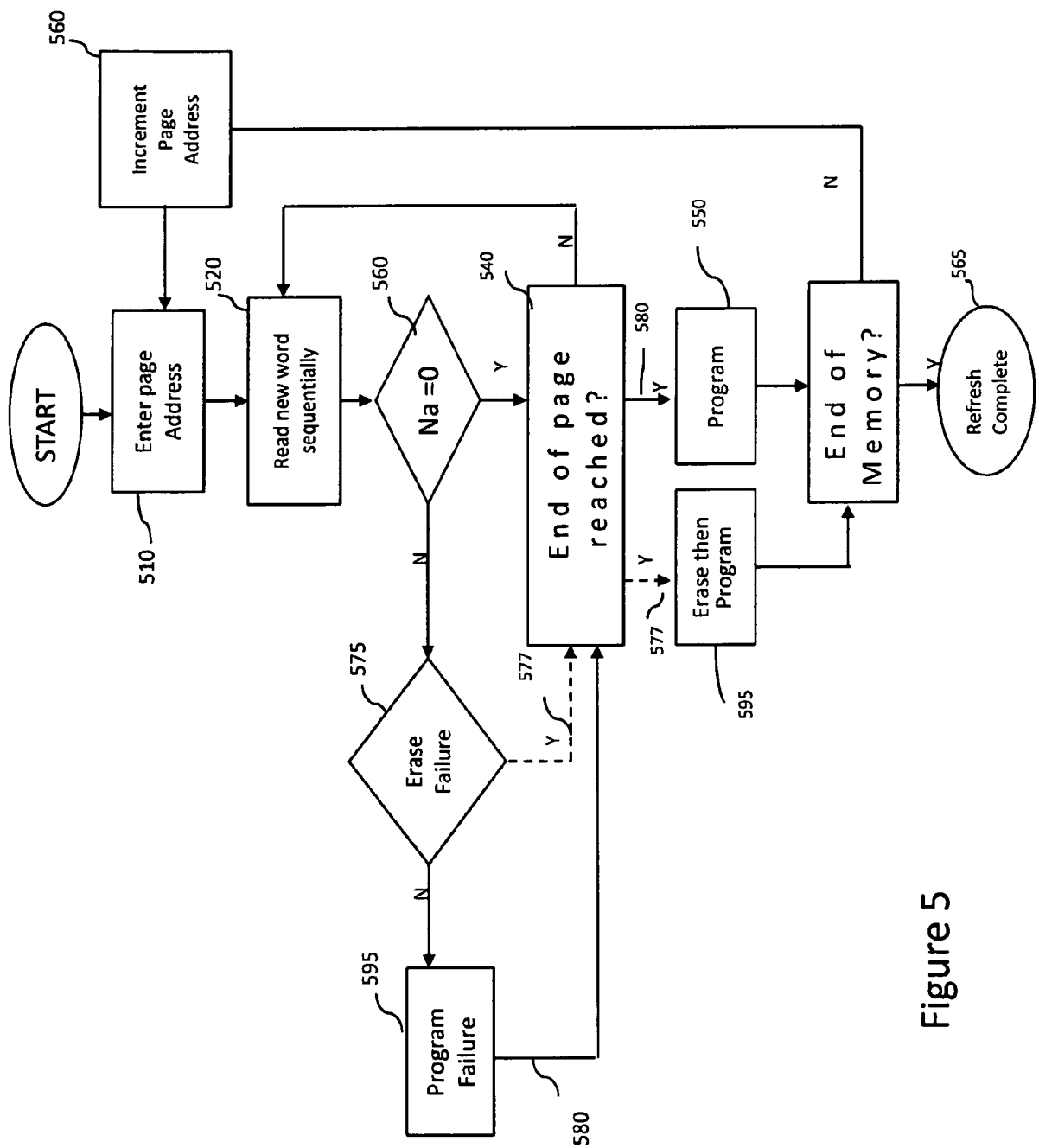
FIG. 5 is a flowchart illustrating a more detailed method for correcting a defective data word based on the failure type detected.

As mentioned previously, the present invention optimizes the handling of a defective word depending on the failure type detected. FIG. 5 is a flowchart illustrating the manner in which different single bit errors are processed in accordance with the present invention. As indicated in FIG. 5, the process begins when a page address 510 is provided to memory. In step 520, ECC circuit 135 sequentially reads out a first word from the page of memory 110. Thereafter, each word from memory 110 is tested by the ECC circuit 135 for correctness.

If the word is determined to be correct, then Na=0, and nothing needs to be done to the word. At which point, step 540 will determine if the end of the page has been reached.

On the other hand, if the word is incorrect, then it must be determined whether the error is an erase failure or a program failure. If the single error is an erase failure 575, then refresh path 577 will be pursued. Otherwise, if the single error is a program failure 595 then the detected error will be corrected through refresh path 580.

In the case where the single error is an erase failure 575, the word will eventually be erased, once each word in the source page has been fully tested by the ECC circuit. As used herein, a source page refers to the page from which the erase failure 575 originated. Consequently, if the end of the source page has been reached, then the source page is erased. Thereafter, the erased page is programmed with correct data in step 595. Once the source page is correct, it will be reprogrammed, or written, into memory 110 of FIG. 1, and the refresh will be considered complete.

Refresh path 580 in conjunction with the detection of a program failure will now be discussed. If a program failure is detected then an erase operation can be skipped or omitted. Omitting the erase operation 590 will substantially improve the refresh time for providing corrected data into the memory array. Consequently, the refresh operation for a program failure 595 is expedited in comparison to the prior method of processing program failures by bypassing an erase operation and proceeding to execute the additional steps of refresh path 580. Specifically, if the end of page 540 has been reached, then it is determined whether there are any additional pages of memory to be evaluated in step 550. If there are additional pages to evaluate, then the page address of memory is incremented in 560 and the entire process of testing each word of a new page is repeated. Only until the end of memory 110 has been reached will the refresh be considered complete 565.

Figure 6:
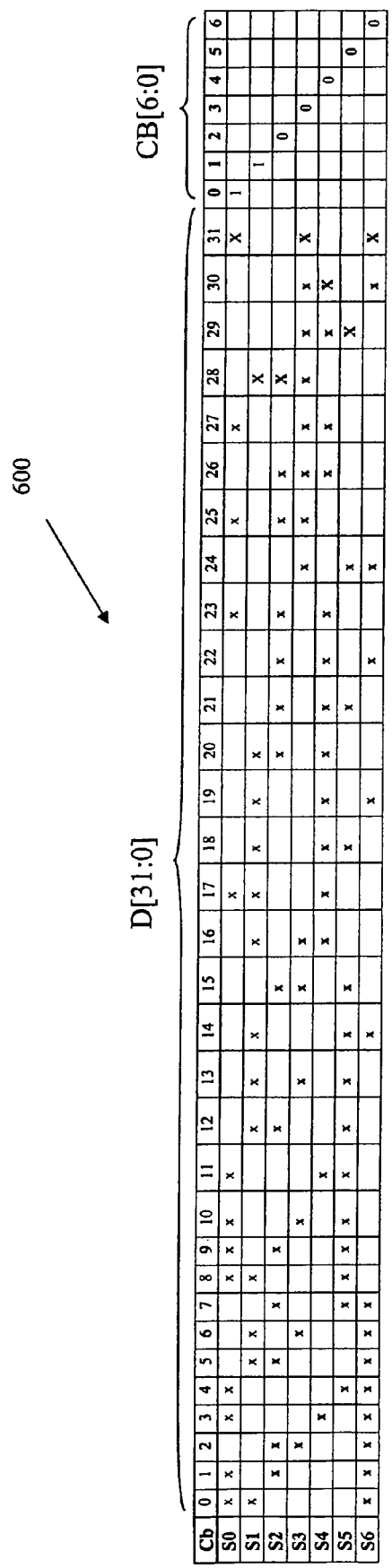
FIG. 6 illustrates a parity-check matrix of the odd-weight Hamming code used in the present invention.

FIG. 6 illustrates a parity-check matrix of the odd-weight column Hamming code used in the present embodiment. Columns 0 to 31 of parity-check matrix 600 show the ECC code generation table for the corresponding bits of the data word D [31:0]. Each "X" in the matrix can represent either a "1" or a "0". The parity generation of the corresponding ECC check bits S[6:0] is shown in the last seven columns of parity-check matrix 600. More specifically, check bit S[O] is generated by performing an exclusive OR operation on the ECC bits D[0:1], D[3:4], D[8:11], D[17], D[23],D[25], and D[27] of the data word D[31:0]. If an odd number of the aforementioned ECC bits have a logic "1" value, then check bit S[0] will have a logic "1" value. Conversely if an even number of the indicated bits have a logic "1" value, then check bit S[0] will have a logic "0" value. Check bits S[1:6] are generated in a similar manner.

Within ECC circuit 135 is a check bit generator (not shown) which generates check bits S[6:0] in response to the data values read from each word in accordance with parity check matrix 600. Check bit generator produces check bits S[6:0] in response to the read data values RD[31:0] in accordance with parity check matrix 600. The check bits S[6:0] are then passed to ECC generator. The ECC generator uses a decoder to perform a bit-wise comparison between check bits S[6:0] and the read check bits RCB[6:0], wherein each of the check bits S[6:0] is exclusive OR'ed with a corresponding one of the read check bits RCB[6:0], as illustrated in the last 7 columns of parity-matrix 600. The resultant syndrome 7-bit word is decoded to identify whether the 39-bit code read from the memory array is free of error, contains a single-bit error, or contains multiple-bit errors. To illustrate the manner in which the check bits [6:0] are correctly generated, assume that an error bit occurs in data word D[31:0], such that the associated syndrome word SYN[6:0] has a non-zero value. The value of syndrome word SYN[6:0] is governed by the column (bit) location of the error bit in the parity-check matrix of FIG. 6. For example, if data bit D[28] has an error, the syndrome word SYN[6:0] will have a value of "0111000". The correct data bits can be obtained by performing a bit-wise exclusive OR operation on check bits 1100000 (that is, the check bits that are shown in columns 33-39), and the new ECC check bits. The new ECC check bits being obtained by performing an exclusive OR operation on the ECC bits D[Q: 1], D[3:4], D[8:11], D[17], D[23],D[25], and D[27] of the data word D[31:0] to produce 1011000. When the original check bits 0.1100000 are exclusive-or'ed with new ECC check bits 1011000 the syndrome for D[28] will be 0111000, which in decimal format equals syndrome 14. A lookup table similar to that shown in Table 1 is then consulted to show that syndrome 14 maps to error location 28.

TABLE 1

Single ErrorDetection

| Syndrome | Error location |
|---|---|
| 1 | 32 |
| 2 | 33 |
| 4 | 34 |
| 8 | 35 |
| 13 | 25 |
| 14 | 28 |
| . | . |
| . | . |
| . | . |
| 100 | 7 |
| 104 | 24 |

Based on this information, the system will use syndrome 14 to repair the error at bit location 28 by inverting the bit at location 28. Table 1 thus defines the manner in which each syndrome maps to a specific bit position to thereby identify the position of an error location. The present invention has been described by various examples above. However, the aforementioned examples are illustrative only and are not intended to limit the invention in any way. The skilled artisan would readily appreciate that the examples above are capable of various modifications. Thus, the invention is defined by the claims set forth below.

We claim:

1. A method for selectively refreshing a nonvolatile memory array having n number of words in a row, each row being organized in a plurality of pages comprising:
    a) providing a page address to the memory array;
    b) reading each word sequentially out of a page corresponding to said address;
    c) providing an ECC circuit to receive each word that is read;
    d) evaluating the integrity of each word with an error correction code (ECC);
    e) providing a signal to indicate whether any word on said page contains a program failure;
    f) refreshing each page that is determined to contain a program failure by writing new data to said address without performing an erase operation.

2. The method of claim 1, wherein steps a)-f) are repeated until all pages of the memory array have been tested.

3. The method of claim 1, wherein said signal corresponds to an erase failure signal that is provided to the refresh controller.

4. The method of claim 1, wherein said signal comprises an error flag that is asserted in a first condition if any one word contains an error and said error flag is asserted in a second condition opposite said first condition if any word is error-free.

5. A method for selectively refreshing a page of memory within a semiconductor integrated circuit, comprising:
    reading one or more words sequentially out of said page of memory;
    performing error detection and correction of each word with an error correction code (ECC);
    providing a signal to indicate whether any of said words contains a specific type of error;
    wherein an erase operation is not performed if the page of memory is determined to be error-free.

6. The method of claim 5, wherein said signal is generated internally from an ECC circuit embedded within a chip that contains the nonvolatile memory.

7. The method of claim 5, wherein an erase operation is not performed if the signal indicates that a word contains a program failure.

8. The method of claim 5, wherein select data words are refreshed during an idle cycle of the memory array.

9. The method of claim 5, wherein the ECC is a modified Hamming code.

10. The method of claim 5, wherein said memory is a nonvolatile memory.

11. The method of claim 10, further comprising reprogramming the page with corrected data without performing an erase operation if the error is attributable to a program failure.

12. The method of claim 10, wherein the memory array is refreshed at regular intervals.

13. The method of claim 10, wherein the memory array is refreshed at power up.

14. The method of claim 10, wherein select words are refreshed during an idle cycle of the memory array.

15. The method of claim 10, wherein said memory is a NOR-type flash memory.

16. The method of claim 5, wherein said memory is a NOR-type flash memory.

17. The method of claim 16, further comprising loading corrected data into the memory array after any page has been reprogrammed.

18. A method for selectively refreshing a nonvolatile memory array, said memory array arranged in rows, each row having n number of data words and being organized as a plurality of pages, said method comprising:
    a) reading each data word sequentially out of a first page of memory and into an ECC circuit;
    b) evaluating the integrity of each data word within the first page with an error correction code (ECC);
    c) providing a signal to a controller to indicate whether any portion of a word contains an error, wherein said signal also identifies the type of failure that generated said error; and
    d) not performing an erase operation for a row of memory if the signal indicates that said row is error-free.

19. A method for selectively refreshing a nonvolatile memory array having n number of data words in a row, each row being organized in a plurality of pages comprising:
    a) reading each word sequentially out of a first page and into an ECC circuit;
    b) evaluating the integrity of each word within the first page with an error correction code (ECC);
    c) providing a signal to indicate whether any word on the first page contains an error;

d) checking each word on a next page in the memory array to determine if an error exists, and providing a signal if any word on said next page contains an error;

e) skipping a refresh operation for each page of the memory array that is found to be error-free;

f) and repeating steps c) and d) until all pages of the memory array have been tested.

20. The method of claim 19, further comprising reprogramming the page with corrected data without performing an erase operation if the error is attributable to a program failure.

21. The method of claim 19, further comprising generating new ECC check bits for words containing an error, and loading a corrected word with new check bits into the memory array.

22. The method of claim 19, wherein the memory array is refreshed at regular intervals.

23. The method of claim 19, wherein the memory array is refreshed at power up.

24. The method of claim 19, wherein select words are refreshed during an idle cycle of the memory array.

* * * * *